United States Patent
Juengling

(10) Patent No.: US 9,054,212 B2
(45) Date of Patent: Jun. 9, 2015

(54) FIN ETCH AND FIN REPLACEMENT FOR FINFET INTEGRATION

(71) Applicant: GLOBALFOUNDRIES Inc., Grand Cayman (KY)

(72) Inventor: Werner Juengling, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/664,062

(22) Filed: Oct. 30, 2012

(65) Prior Publication Data

US 2014/0117419 A1    May 1, 2014

(51) Int. Cl.
| | |
|---|---|
| *H01L 21/311* | (2006.01) |
| *H01L 21/8234* | (2006.01) |
| *H01L 29/66* | (2006.01) |

(52) U.S. Cl.
CPC .. *H01L 21/823431* (2013.01); *H01L 29/66795* (2013.01); *H01L 29/6681* (2013.01)

(58) Field of Classification Search
CPC .................. H01L 29/16; H01L 29/78
USPC ............ 257/288, 618, E21.214, E21.23, 257/E29.082, E29.255; 438/692, 702
See application file for complete search history.

(56) References Cited

U.S. PATENT DOCUMENTS

| | | | | |
|---|---|---|---|---|
| 8,476,137 B1* | 7/2013 | LiCausi et al. | ................ | 438/270 |
| 8,481,410 B1* | 7/2013 | LiCausi et al. | ................ | 438/478 |
| 8,941,153 B2* | 1/2015 | Lee et al. | ................ | 257/288 |
| 8,951,870 B2* | 2/2015 | Basker et al. | ................ | 438/283 |
| 2008/0105931 A1* | 5/2008 | Kang et al. | ................ | 257/397 |
| 2011/0133292 A1* | 6/2011 | Lee et al. | ................ | 257/401 |
| 2013/0244387 A1* | 9/2013 | Cho | ................ | 438/283 |
| 2013/0270641 A1* | 10/2013 | Chi | ................ | 257/351 |
| 2013/0320294 A1* | 12/2013 | Cappellani et al. | ................ | 257/9 |
| 2013/0330889 A1* | 12/2013 | Yin et al. | ................ | 438/197 |
| 2014/0061793 A1* | 3/2014 | Pei et al. | ................ | 257/347 |
| 2014/0097518 A1* | 4/2014 | Cheng et al. | ................ | 257/618 |
| 2014/0151766 A1* | 6/2014 | Eneman et al. | ................ | 257/288 |
| 2014/0151814 A1* | 6/2014 | Giles et al. | ................ | 257/369 |
| 2014/0353760 A1* | 12/2014 | Loubet et al. | ................ | 257/369 |
| 2014/0353767 A1* | 12/2014 | Liu et al. | ................ | 257/401 |
| 2014/0374829 A1* | 12/2014 | Sudo | ................ | 257/347 |
| 2015/0017781 A1* | 1/2015 | Lin et al. | ................ | 438/424 |
| 2015/0024573 A1* | 1/2015 | Jacob et al. | ................ | 438/424 |
| 2015/0028398 A1* | 1/2015 | Cheng et al. | ................ | 257/288 |
| 2015/0028454 A1* | 1/2015 | Cheng et al. | ................ | 257/616 |

* cited by examiner

*Primary Examiner* — Fernando L Toledo
*Assistant Examiner* — Victoria K Hall
(74) *Attorney, Agent, or Firm* — Ditthavong & Steiner, P.C.

(57) ABSTRACT

A method and device are provided for etching and replacing silicon fins in connection with a FinFET integration process. Embodiments include providing a first plurality and a second plurality of silicon fins on a silicon wafer with an oxide between adjacent silicon fins; forming a first nitride liner on an upper surface of the first plurality of silicon fins and the oxide therebetween; etching the second plurality of silicon fins, forming trenches; removing the first nitride liner; depositing a second nitride liner on an upper surface of the first plurality of silicon fins and the oxide therebetween and in the trenches; removing the second nitride liner down to the upper surface of the first plurality of silicon fins; and recessing the oxide.

17 Claims, 5 Drawing Sheets

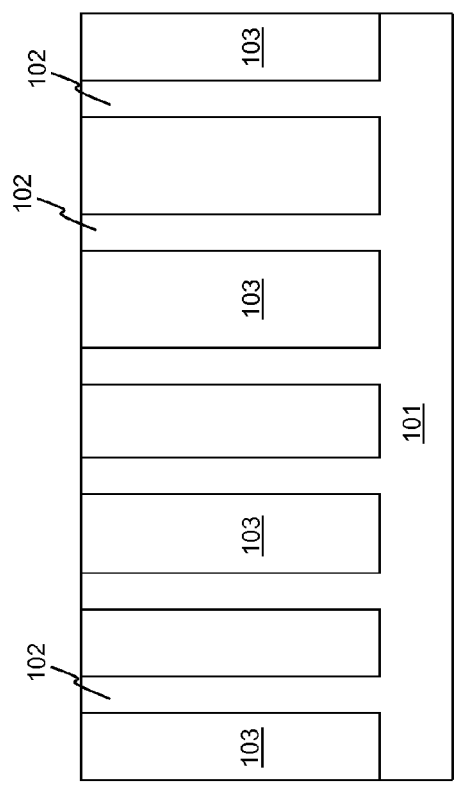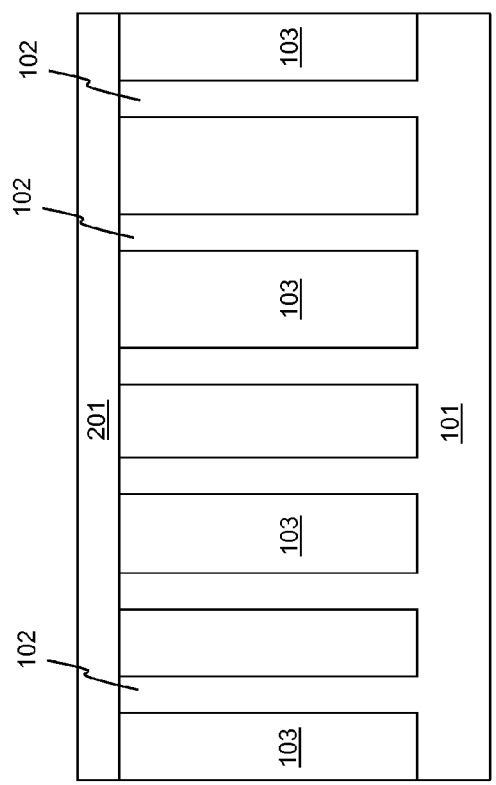

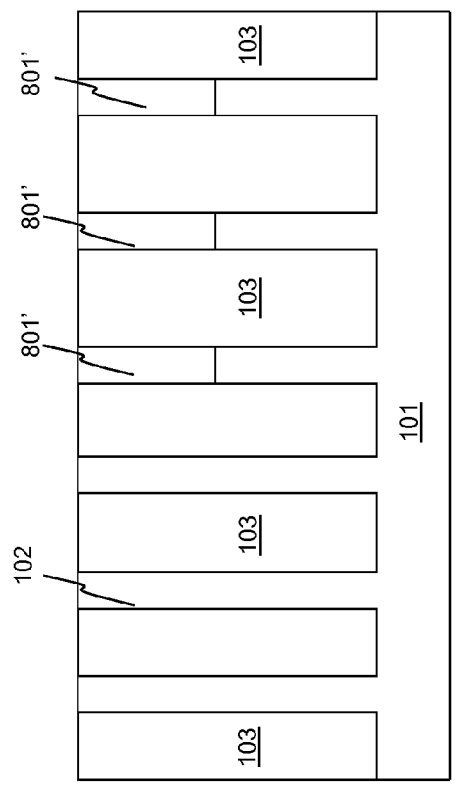
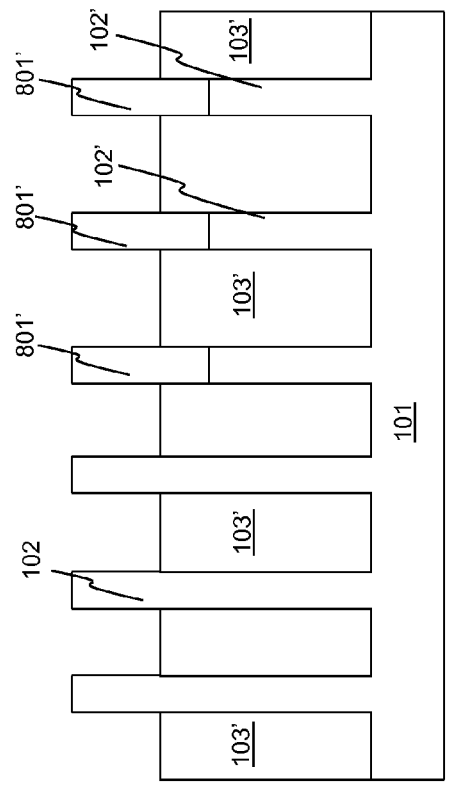

FIN ETCH AND FIN REPLACEMENT FOR FINFET INTEGRATION

TECHNICAL FIELD

The present disclosure relates to a FinFET integration process, and more particularly to a fin replacement process.

BACKGROUND

FinFet integration generally involves the formation of a "sea-of-fins" to obtain fin uniformity, which is then followed by a dry etch process that removes the fins that are not needed for the electrical circuit and/or the fins that need to be removed for other reasons, e.g., gate contacts. However, this fin removal process usually causes wide and deep trenches that are costly to fill. Further, the typical fin removal process usually requires an additional chemical mechanical polishing (CMP) step that is performed on a non-uniform wafer, which after fin recess leaves behind topography that has to be accounted for during the gate formation.

A need therefore exists for a methodology enabling removal of unnecessary fins without requiring costly trench etching and trench filling as well as producing a planar wafer as an end result.

SUMMARY

An aspect of the present disclosure is a method for etching and replacing silicon fins.

Another aspect of the present disclosure is a device including silicon fins and nitride fins.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a first plurality and a second plurality of silicon fins on a silicon wafer with an oxide between adjacent silicon fins; forming a first nitride liner on an upper surface of the first plurality of silicon fins and the oxide therebetween; etching the second plurality of silicon fins, forming trenches; removing the first nitride liner; forming a second nitride liner on an upper surface of the first plurality of silicon fins and the oxide therebetween and in the trenches; removing the second nitride liner down to the upper surface of the first plurality of silicon fins; and recessing the oxide.

Aspects of the present disclosure include forming the first nitride liner to a thickness of 50 angstroms (Å) to 100 Å. Another aspect includes forming the first nitride liner from furnace nitride or plasma-enhanced chemical vapor deposition (PECVD) nitride. Other aspects include forming the first nitride liner by depositing a nitride layer on an upper surface of the first and second pluralities of silicon fins and on the oxide therebetween; forming a photo mask on the first nitride layer on the first plurality of silicon fins and on the oxide therebetween; and etching away the nitride layer on the second plurality of fins and on the oxide therebetween. Further aspects include stripping the photo mask after etching the nitride layer. Additional aspects include dry etching the nitride layer on the second plurality of silicon fins and on the oxide therebetween. Another aspect includes dry etching the nitride liner selectively against the underlying oxide. Other aspects include etching the second plurality of silicon fins by dry etching the fins to a depth of 500 Å to 5000 Å. Further aspects include isotropically wet etching any stringers in the trenches following the dry etching of the silicon fins. Additional aspects include etching the second plurality of silicon fins by etching the silicon fins to a depth of 500 Å to 5000 Å and then isotropically wet etching any stringers remaining in the trenches following the wet etching. Further aspects include removing the first nitride liner by wet or dry etching. Another aspect includes forming the second nitride liner on the upper surface of the first plurality of silicon fins and the oxide therebetween and in the trenches to a thickness of 75 percent of a width of one of the plurality of silicon fins. Other aspects include forming the second nitride liner from furnace nitride. Further aspects include removing the second nitride liner down to the upper surface of the first plurality of silicon fins by dry etching or CMP the second nitride liner. Another aspect includes recessing the oxide by atomic layer etching or wet etching the oxide to a depth of 200 Å to 400 Å. Other aspects include recessing the oxide by etching with high selectivity to silicon and nitride.

Another aspect of the present disclosure is a device including a silicon wafer including a plurality of silicon fins, a plurality of nitride fins, and an oxide filling a portion of a recess between each pair of adjacent fins. Aspects of the present disclosure include an upper surface of the silicon fins and an upper surface of the nitride being coplanar.

Another aspect of the present disclosure is a method including: providing first and second pluralities of silicon fins and an oxide between adjacent pairs of fins on a silicon wafer; forming a furnace nitride to a thickness of 50 Å to 100 Å on an upper surface of the first and second pluralities of silicon fins and on the oxide therebetween; forming a photo mask on the furnace nitride on the first plurality of fins and on the oxide therebetween; dry etching the furnace nitride on the second plurality of fins and on the oxide therebetween, exposing the second plurality of fins; dry etching the exposed second plurality of silicon fins to a depth of 500 Å to 5000 Å, forming trenches; wet etching any stringers remaining in the trenches following the dry etching; stripping the photo mask; etching the remaining furnace nitride; forming a second furnace nitride to a thickness of 75 percent of a width of one of the plurality of silicon fins on the upper surface; CMP the furnace nitride; and atomic layer etching the oxide to a depth of 200 Å to 400 Å. A further aspect includes a FinFET multi-gate transistor produced by the disclosed methods.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 10 schematically illustrate sequential steps of a method in accordance with an exemplary embodiment of the present disclosure.

DETAILED DESCRIPTION

Figure 3:
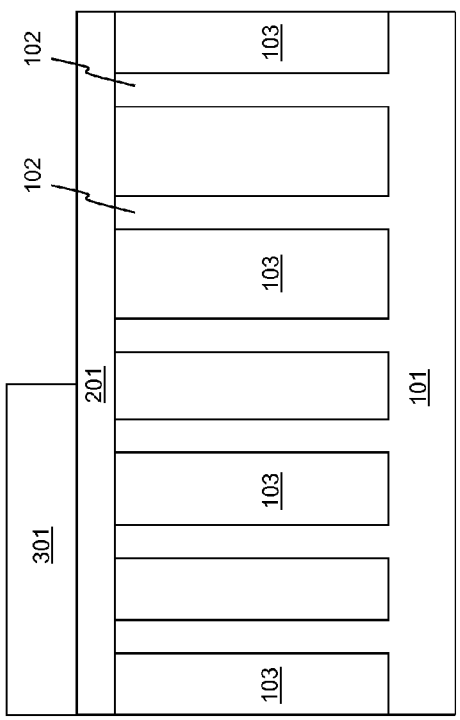

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of wide, deep trenches that are costly to fill attendant upon fin removal and replacement. In addition, current processes usually require an additional CMP step that is performed on a non-uniform wafer, which after fin recess leaves behind topography that must be accounted for during the gate formation.

Methodology in accordance with embodiments of the present disclosure includes providing a first plurality and a second plurality of silicon fins on a silicon wafer with an oxide between adjacent silicon fins; forming a first nitride liner on an upper surface of the first plurality of silicon fins and the oxide therebetween; etching the second plurality of silicon fins, forming trenches; removing the first nitride liner; depositing a second nitride liner on an upper surface of the first plurality of silicon fins and the oxide therebetween and in the trenches; removing the second nitride liner down to the upper surface of the first plurality of silicon fins; and recessing the oxide.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Referring to FIG. 1, silicon fins 102 are formed, e.g. by etching, in a silicon wafer 101. An oxide 103 is filled between adjacent fins 102. Fins 102 may be formed to a width of 80 Å to 800 Å, for example 200 Å, and to a depth of 800 Å to 5000 Å, e.g. 2000 Å. The oxide 103 may, for example, be formed of tetraethyl orthosilicate (TEOS), high aspect ratio process (HARP) material, or spin-on dielectric (SOD) material including a densification process.

As illustrated in FIG. 2, a nitride layer 201 for example of furnace nitride, e.g., formed at 760° C., or PECVD nitride, is deposited on the upper surface of the silicon fins 102 and on the oxide 103 therebetween. The nitride layer 201 may be formed to a thickness of 50 Å to 100 Å.

Figure 4:
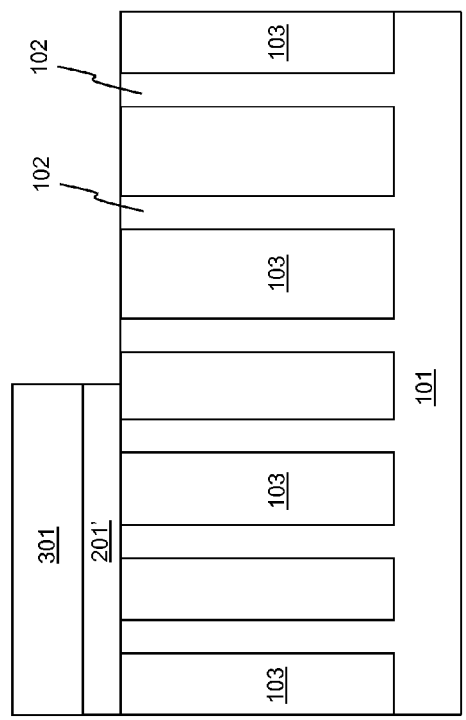

Referring to FIG. 3, a photo mask 301 is formed on the nitride layer 201, on a plurality of silicon fins 102 and on the oxide 103 therebetween. In particular, the photo mask 301 is formed over and protects the permanent fins, and exposes areas where fins need to be removed. The nitride layer 201 is then dry etched selectively against the underlying oxide 103, leaving a first nitride liner 201' beneath the photo mask 301, as illustrated in FIG. 4.

Figure 5:
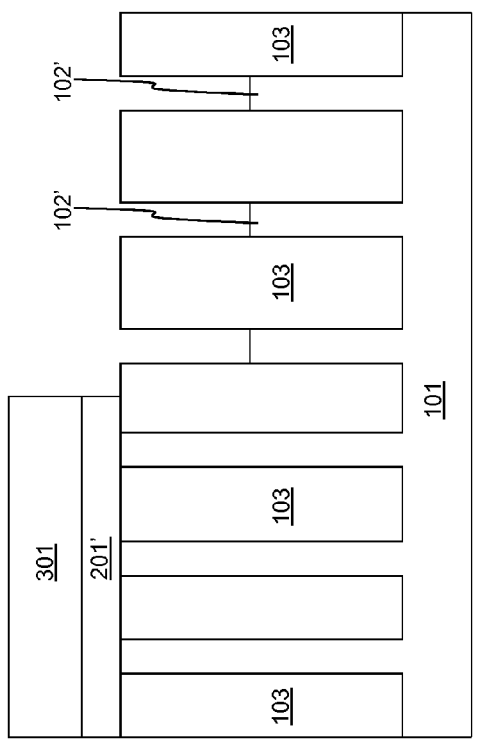

Referring to FIG. 5, the exposed silicon fins 102 are dry etched to a depth of 500 Å to 5000 Å, e.g., 2000 Å, resulting in etched silicon fins 102'. By way of example, the dry etch chemistry may be a sulfur hexafluoride ($SF_6$) based chemistry or a nitrogen trifluoride ($NF_3$) based chemistry. The dry etch process may be followed by a short isotropic wet etch or a short silicon oxidation to remove any "stringers" that may have formed in overhanging areas in the trenches or as a result of small defects that block the dry etch process. Alternatively, rather than dry etching the exposed silicon fins 102, the exposed silicon fins 102 may be wet etched using a nitric acid ($HNO_3$) plus hydrofluoric (HF) acid or a tetramethylammonium hydroxide (TMAH).

Figure 6:
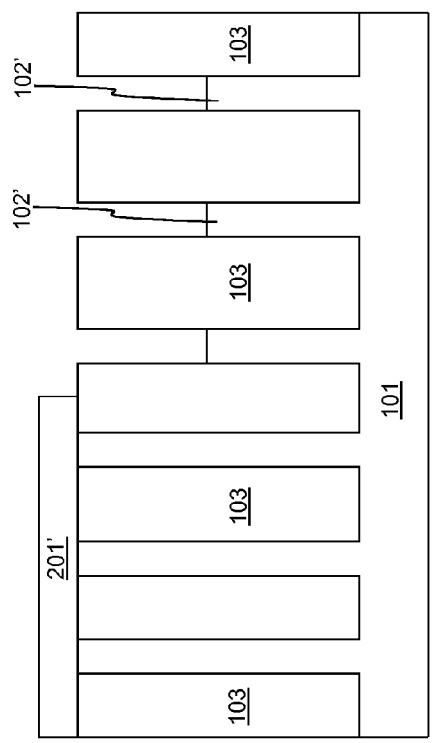
Figure 7:
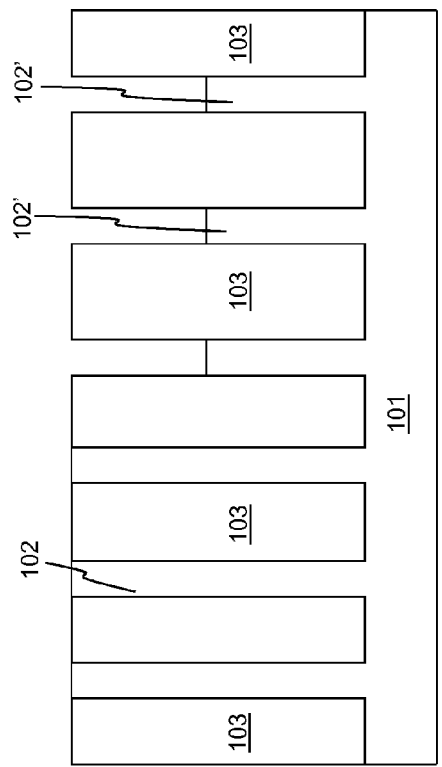

Once the exposed fins have been etched to an appropriate depth, the photo mask 301 is stripped off, as illustrated in FIG. 6. Adverting to FIG. 7, the first nitride liner 201' is removed from the upper surface of the first plurality of silicon fins 201, by a wet or dry etch. This avoids a step in the wafer 101 where the etched first nitride liner 201' was previously located.

Figure 8:
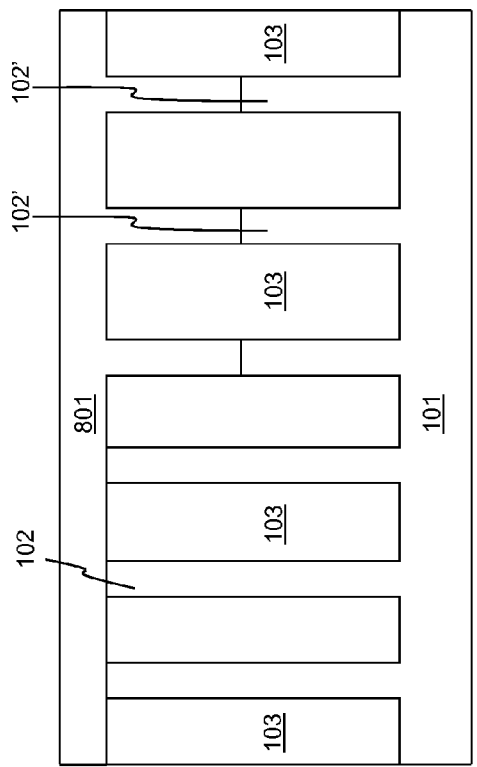

Referring to FIG. 8, a second nitride liner 801 is formed on the upper surface of silicon fins 102, the etched silicon fins 102', and oxide 103 therebetween. The second nitride liner 801 will completely fill the trenches above the etched silicon fins 102' and is formed above silicon fins 102 and oxide 103 to a thickness of 75 percent of a width of one of the silicon fins 102. More specifically, the second nitride liner 801 may be formed of furnace nitride, which yields better step coverage than PECVD nitride. Moreover, removing the etched first nitride liner 201' avoids a step in the second nitride liner 801.

As illustrated in FIG. 9, the second nitride liner 801 is removed down to the upper surface of silicon fins 102 by dry etching or CMP. As a result, only nitride 801' formed in the trenches on top of the etched silicon fins 102' remains.

Referring to FIG. 10, the oxide 103' is recessed to a depth of 200 Å to 400 Å by atomic layer etching or wet etching with high selectivity to silicon and nitride. As a result, both the silicon fins 102 and the nitride fins 801' are exposed. More specifically, the upper surface of the silicon fins 102 and an upper surface of the nitride fins 801' are coplanar.

The embodiments of the present disclosure can achieve several technical effects including avoiding costly trench etching and trench filling and achieving a planar surface after removal of the unnecessary fins. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices including FinFETs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a first plurality and a second plurality of silicon fins on a silicon wafer with an oxide between adjacent silicon fins;
   forming a first nitride liner on an upper surface of the first plurality of silicon fins and the oxide therebetween;
   etching the second plurality of silicon fins, forming trenches;
   removing the first nitride liner;
   forming a second nitride liner on an upper surface of the first plurality of silicon fins and the oxide therebetween and in the trenches;
   removing the second nitride liner down to the upper surface of the first plurality of silicon fins; and
   recessing the oxide.

2. The method according to claim 1, comprising forming the first nitride liner to a thickness of 50 angstroms (Å) to 100 Å.

3. The method according to claim 1, wherein the first nitride liner comprises furnace nitride or plasma-enhanced chemical vapor deposition (PECVD) nitride.

4. The method according to claim 1, comprising forming the first nitride liner by:
   depositing a first nitride layer on an upper surface of the first and second pluralities of silicon fins and on the oxide therebetween;
   forming a photo mask on the first nitride layer on the first plurality of silicon fins and on the oxide therebetween; and
   etching away the first nitride layer on the second plurality of fins and on the oxide therebetween.

5. The method according to claim 4, comprising stripping the photo mask after etching the first nitride layer.

6. The method according to claim 4, comprising dry etching the first nitride layer on the second plurality of silicon fins and on the oxide therebetween.

7. The method according to claim 6, comprising dry etching the first nitride layer selectively against the underlying oxide.

8. The method according to claim 1, comprising etching the second plurality of silicon fins by:
   dry etching the second plurality of silicon fins to a depth of 500 Å to 5000 Å.

9. The method according to claim 8, further comprising isotropically wet etching any stringers remaining in the trenches following the dry etching of the second plurality silicon fins.

10. The method according to claim 1, comprising etching the second plurality of silicon fins by:
    wet etching the second plurality of silicon fins to a depth of 500 Å to 5000 Å; and
    isotropically wet etching any stringers remaining in the trenches following the wet etching.

11. The method according to claim 1, comprising removing the first nitride liner by wet or dry etching.

12. The method according to claim 1, comprising forming the second nitride liner on the upper surface of the first plurality of silicon fins and the oxide therebetween and in the trenches to a thickness of 75 percent of a width of one silicon fin of the first or second plurality of silicon fins.

13. The method according to claim 12, wherein the second nitride liner comprises furnace nitride.

14. The method according to claim 1, comprising removing the second nitride liner down to the upper surface of the first plurality of silicon fins by dry etching or chemical mechanical polishing (CMP) the second nitride liner.

15. The method according to claim 1, comprising recessing the oxide by atomic layer etching or wet etching the oxide to a depth of 200 Å to 400 Å.

16. The method according to claim 1, comprising recessing the oxide by etching with high selectivity to silicon and nitride.

17. A method comprising:
    providing first and second pluralities of silicon fins and an oxide between adjacent fins on a silicon wafer;
    forming a furnace nitride to a thickness of 50 Å to 100 Å on an upper surface of the first and second pluralities of silicon fins and on the oxide therebetween;
    forming a photo mask on the furnace nitride on the first plurality of fins and on the oxide therebetween;
    dry etching the furnace nitride on the second plurality of fins and on the oxide therebetween, exposing the second plurality of fins;
    dry etching the exposed second plurality of silicon fins to a depth of 500 Å to 5000 Å, forming trenches;
    wet etching any stringers remaining in the trenches following the dry etching;
    stripping the photo mask;
    etching the remaining furnace nitride;
    forming a second furnace nitride to a thickness of 75 percent of a width of one silicon fin of the first or second plurality of silicon fins on the upper surface;
    chemical mechanical polishing (CMP) the second furnace nitride; and
    atomic layer etching the oxide to a depth of 200 Å to 400 Å.

* * * * *